United States Patent
Dyer

(10) Patent No.: US 8,686,343 B2
(45) Date of Patent: Apr. 1, 2014

(54) AVALANCHE PHOTODIODE CIRCUITS WITH PROTECTION AGAINST DAMAGE FROM SUDDEN INCREASES IN INCIDENT LIGHT LEVEL

(75) Inventor: David Dyer, Coventry (GB)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 334 days.

(21) Appl. No.: 13/059,437

(22) PCT Filed: Aug. 20, 2008

(86) PCT No.: PCT/EP2008/060872
§ 371 (c)(1),
(2), (4) Date: Jun. 11, 2011

(87) PCT Pub. No.: WO2010/020278
PCT Pub. Date: Feb. 25, 2010

(65) Prior Publication Data
US 2011/0233385 A1  Sep. 29, 2011

(51) Int. Cl.
*H01J 40/14* (2006.01)
(52) U.S. Cl.
USPC ...................................... 250/214 R
(58) Field of Classification Search
USPC ...................................... 250/214 R
See application file for complete search history.

(56) References Cited

U.S. PATENT DOCUMENTS

| | | | |
|---|---|---|---|
| 5,953,690 A * | 9/1999 | Lemon et al. | 702/191 |
| 6,525,305 B2 * | 2/2003 | Deschamps et al. | 250/214 R |
| 6,643,472 B1 | 11/2003 | Sakamoto et al. | |
| 7,265,333 B2 * | 9/2007 | Ichino et al. | 250/214 R |
| 2003/0122533 A1 * | 7/2003 | Prescott | 323/313 |
| 2005/0001150 A1 * | 1/2005 | Yonemura | 250/214 R |
| 2007/0131847 A1 * | 6/2007 | Yao et al. | 250/214 R |

FOREIGN PATENT DOCUMENTS

| | | |
|---|---|---|
| JP | 58 124339 A | 7/1983 |
| JP | 03 097302 A | 4/1991 |
| JP | 11 275755 A | 10/1999 |
| JP | 2005 072376 A | 3/2005 |
| JP | 2006 287307 A | 10/2006 |
| JP | 2008 028537 A | 2/2008 |

OTHER PUBLICATIONS

PCT International Search Report, dated Jul. 15, 2009, in connection with International Application No. PCT/EP2008/060872.

* cited by examiner

*Primary Examiner* — Thanh Luu
(74) *Attorney, Agent, or Firm* — Potomac Patent Group PLLC

(57) ABSTRACT

An avalanche photodiode circuit, comprising an avalanche photodiode typically connected in parallel to a capacitor, in which there is provided a current shunt circuit which activates to shunt current from the avalanche photodiode in response to detecting a decrease in the impedance of the avalanche photodiode, typically measured by determining the slope of the voltage across the avalanche photodiode. By using this circuit, the avalanche photodiode can be protected from sudden increases in incident light level decreasing the impedance of the avalanche photodiode to an extent that the energy such as is stored in the capacitor can damage the structure of the avalanche photodiode.

13 Claims, 1 Drawing Sheet

AVALANCHE PHOTODIODE CIRCUITS WITH PROTECTION AGAINST DAMAGE FROM SUDDEN INCREASES IN INCIDENT LIGHT LEVEL

TECHNICAL FIELD

This invention relates to avalanche photodiode circuits.

BACKGROUND

Avalanche photodiodes are semiconductor-based photodetectors where light incident on a reverse biased semiconductor junction changes the current flowing through the junction. The current flow can be used to indicate the incident light intensity.

When used in fibre-optic communication systems, avalanche photodiodes typically require a reverse bias voltage of between 10 and 100 V. To provide electrical decoupling from the effects of the incident signal's optical modulation, a bypass capacitor is typically placed across the avalanche photodiode. It has been noted that sudden increases in incident light level, as might occur when using an Optical Time Domain Reflectometer (OTDR) to determine the location of a fibre break, can lead to a corresponding increase in the current flowing through the avalanche photodiode to the extent that the crystal structure of the avalanche photodiode is damaged.

SUMMARY

According to a first aspect of the invention, there is provided an avalanche photodiode circuit comprising an avalanche photodiode, in which there is provided a current shunt circuit which activates to shunt current from the avalanche photodiode in response to detecting a decrease in the impedance of the avalanche photodiode.

By shunting current, energy can be dissipated in the shunt circuit rather than in the avalanche photodiode. The inventor has appreciated that a source external to the avalanche photodiode, such as a power supply, that otherwise would have been supplying a small amount of current to the avalanche photodiode is likely to be able to suddenly provide sufficient energy to damage the structure (particularly the crystal structure) of the avalanche photodiode, and that it is advantageous to shunt the current elsewhere than through the avalanche photodiode. The avalanche photodiode may therefore be less liable to damage on occurrence of sudden increases in light level that lead to a sudden drop in impedance.

This circuit is particularly applicable where the circuit also comprises a capacitor in parallel with the avalanche photodiode. Such capacitors are commonly employed to decouple the bias voltage applied from the signal modulation. The invention is advantageous in this case because, as the inventor has realised, the capacitor represents a store of energy that can damage the avalanche photodiode should the impedance of the avalanche photodiode suddenly drop. Merely removing the power supply in such a case, even if that could be achieved sufficiently simply, would not save the avalanche photodiode from the energy stored in the capacitor.

As suggested above, even with no capacitor present, current can be available from a power supply; this current may be sufficient to damage the avalanche photodiode should a sudden bright light be applied.

The current shunt circuit typically comprises a normally open switch coupled in parallel with the avalanche photodiode and which is arranged to close should the current shunt circuit detect the decrease in impedance of the avalanche photodiode. The switch may be a semiconductor switch, such as a transistor.

Typically, the decrease in impedance must be greater than a threshold rate before the current shunt circuit will shunt current. This allows the circuit to differentiate between normal modulation that occurs when receiving an optical signal and irregular operation.

In the preferred embodiment, the circuit is arranged to detect the decrease in impedance of the avalanche photodiode by detecting a decrease in the voltage across the avalanche photodiode and to shunt current in response thereto. Accordingly, the circuit may comprise a voltage slope-determining circuit operable to determine the rate of change of the voltage across the avalanche photodiode.

In such a case, the current shunt circuit may be arranged to shunt current only if the rate of change of the voltage across the avalanche photodiode represents a decrease in the magnitude of that voltage of approximately 1 volt per microsecond.

Alternatively, the circuit may be arranged to detect the decrease in impedance of the avalanche photodiode by detecting an increase in current through the avalanche photodiode. It is this current flow through, and the associated energy dissipation in, the avalanche photodiode that is seen as damaging the avalanche photodiode. In such a case, the slope-determining circuit may be provided as a current slope-determining circuit arranged to determine the rate of change of current through the avalanche photodiode. The circuit may be arranged to active the current shunt circuit should the rate of change of current exceed a threshold.

In order to prevent damage to the structure of the avalanche photodiode, and in particular the crystal structure, it is desirable for sudden increases in current to be quickly responded to. The voltage detection circuit may capable of determining the change in voltage over a given timescale. The timescale may be less than 100 nanoseconds to 10 microseconds. Typically, the current shunt circuit could be activated within that timescale also.

Where the avalanche photodiode is used for detecting a modulated signal carried on light incident to the avalanche photodiode, that modulation may have a characteristic time period. Where the modulation is digital, such as binary, the time period may be the bit length. In such a case, the timescale may be at least 100 times the characteristic time period.

It is undesirable that the current shunt circuit be activated by the normal modulation of a signal incident on the avalanche photodiode, as that is what the avalanche photodiode is measuring. Accordingly, the circuit may only be responsive to decreases in impedance over periods greater than the timescale.

As such, the circuit may comprise an averaging circuit which is arranged to determine an average impedance, such as a mean impedance, before the circuit determines whether the impedance has dropped sufficiently to activate the current shunt circuit. The averaging circuit may operate to average the voltage across the avalanche photodiode before the voltage slope-determining circuit determines the slope of the voltage. The averaging may be over the timescale. This can be seen as a form of low-pass filter.

Avalanche photodiode circuits commonly comprise a transimpedance amplifier on the same branch of the parallel circuit as the avalanche photodiode. In such a case, the voltage across the whole branch can be used to detect the decrease in impedance, and herein when referring to the voltage across the avalanche photodiode, that voltage may be read to include the voltage across the avalanche photodiode and the transimpedance amplifier.

In a preferred embodiment, once the shunt circuit has started shunting current, the voltage across the avalanche photodiode decreases at a sufficient rate, due to the shunting of current, that the current shunt circuit will keep shunting current until the rate of voltage change across the avalanche photodiode falls to a threshold, typically zero or near zero. This may correspond to a low, typically zero, voltage across the avalanche photodiode. In effect, the current shunt can be considered self-sustaining until the energy in the capacitor is spent to a safe level.

Additionally or alternatively, once the shunt circuit has started shunting current, it will keep shunting current for a predetermined length of time. This is equally as simple to implement.

According to a second aspect of the invention, there is provided a method of protecting an avalanche photodiode circuit having an avalanche photodiode, the method comprising shunting current from the avalanche photodiode in response to detecting a decrease in impedance of the avalanche photodiode.

This method is particularly applicable where the avalanche photodiode circuit also comprises a capacitor in parallel with the avalanche photodiode. The invention is advantageous in this case because, as the inventor has realised, the capacitor represents a store of energy that can damage the avalanche photodiode should the impedance of the avalanche photodiode suddenly drop.

Typically, the decrease in impedance must be greater than a threshold rate before the current is shunted.

However, it is undesirable that the current be shunted in response to the normal modulation of a signal incident on the avalanche photodiode, as that is what the avalanche is measuring. Accordingly, the current may only be shunted in response to decreases in impedance over periods greater than a predetermined timescale. This timescale may be less than 100 nanoseconds to 10 microseconds. Where the avalanche photodiode is used for detecting a modulated signal carried on light incident to the avalanche photodiode, that modulation may have a characteristic time period. Where the modulation is digital, such as binary, the time period may be the bit length. In such a case, the timescale may be at least 100 times the characteristic time period.

As such, the method may comprise averaging the impedance, typically using the mean, before determining whether the impedance has dropped sufficiently to shunt current. The averaging may operate to average the voltage across the avalanche photodiode before determining the slope of the voltage. This can be seen as a form of low-pass filter.

In the preferred embodiment, the method comprises detecting the decrease in impedance of the avalanche photodiode by detecting a decrease in the voltage across the avalanche photodiode. Typically, the rate of decrease in the voltage would be determined, and current shunted if the rate of decrease exceeded a threshold.

Alternatively, the method may comprise determining the decrease in impedance of the avalanche photodiode by detecting an increase in current through the avalanche photodiode. It is this current flow through, and the associated energy dissipation in, the avalanche photodiode that is seen as damaging the avalanche photodiode. In such a case, rate of change of the current through the avalanche photodiode may be determined, and the circuit may be arranged to shunt current should the rate of change of current exceed a threshold.

Once current has started to be shunted, shunting may continue until the voltage across the avalanche photodiode falls below a lower threshold. This is especially the case where the rate of change of voltage is used to determine the decrease in impedance; in such a case by shunting current, the voltage will drop, causing the shunting to continue thus sustaining the shunting of current.

Additionally or alternatively, once the current has started being shunted, shunting may continue for a predetermined length of time.

DETAILED DESCRIPTION

Figure 1:
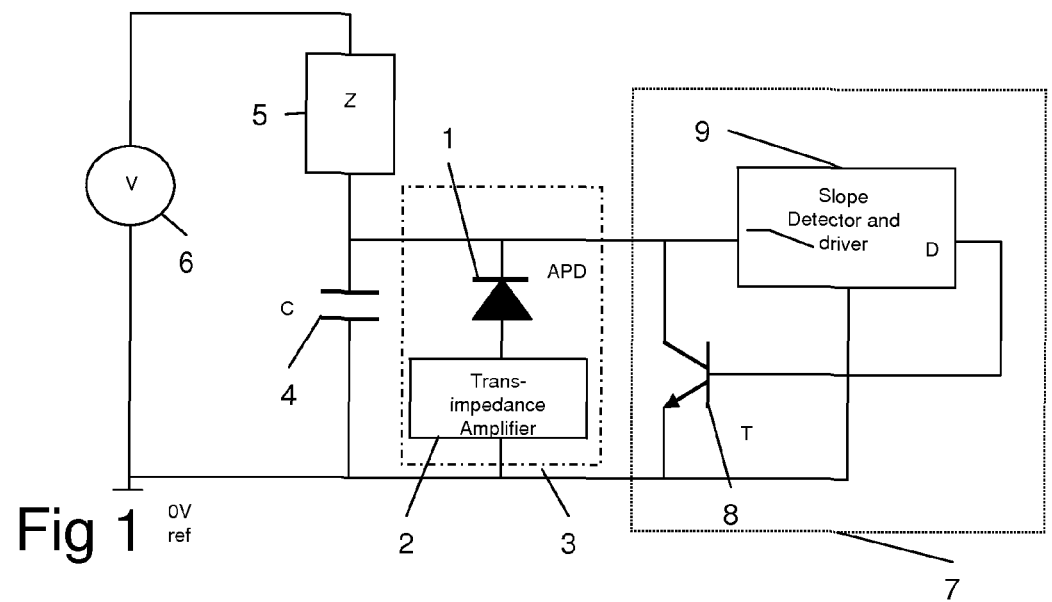
FIG. 1 shows a circuit diagram of an avalanche photodiode circuit according to an embodiment of the invention.

The accompanying figures show an avalanche photodiode circuit according to an embodiment of the invention, and depict its operation. The avalanche photodiode circuit comprises an avalanche photodiode (APD) 1 connected in series with the input stage of a transimpedance amplifier 2, which converts the varying current through the APD 1 into a more easily measurable voltage. Together the APD and the transimpedance amplifier form an APD module 3.

The APD module 3 is connected in parallel to a capacitor 4. The combined capacitor 4 and APD module 3 parallel circuit is connected in series to an impedance 5. This combination is in turn connected in parallel to a voltage source 6.

In normal operation, the voltage supply provides a controllable reverse bias voltage for the APD 1 of typically between 10V and 100V. To provide electrical decoupling from the effects of usual optical modulation, the capacitor 4 acts as a bypass capacitor.

The impedance 5 is variable (although it need not be), and can be set to limit current from the voltage source 6 for normal operation. In effect, the impedance can be set to adjust the operating point for different mean light levels. However, in the case of a sudden increase in the mean light level at the APD 1, a sudden decrease in the impedance of the APD 1 will occur. Regardless of state of the impedance 5, there can be sufficient energy stored in the capacitor 4 to cause a large current to flow through the APD 1 in its low impedance state. This can lead to damage to the semiconductor structures.

However, this problem can be at least partially ameliorated by the provision of a current shunt circuit 7. This circuit comprises a transistor switch 8 controlled by a slope-determining circuit 9. The transistor switch 8 is provided in parallel with the APD module 3, with the slope-determining circuit 9 taking the mean of the voltage across the APD module 3 over a window having a predetermined timescale. This predetermined timescale is typically at least 100 times the bit rate of the signal incident on the APD 1; in the present embodiment a typical timescale would be 0.5 microseconds. The slope-determining circuit 9 also determines a rate of decrease of the average voltage. Although the transistor switch 8 is shown as an npn bipolar transistor, other types of transistor or controlled semiconductor switches could be used.

In normal use, the transistor switch 8 remains open, thus not affecting the operation of the circuit. However, should the slope-determining circuit 9 detect a sudden decrease in the voltage across APD unit 3 (say, of more than 1 V/µs over the timescale of 0.5 µs), then it closes the transistor switch 8, allowing it to shunt current from the capacitor 4. Accordingly, instead of being dissipated by APD 1, the energy stored in the capacitor will largely be dissipated by the transistor switch 8, thus protecting the APD 1 from damage, with no damage being done to the impedance 5.

Figure 2:
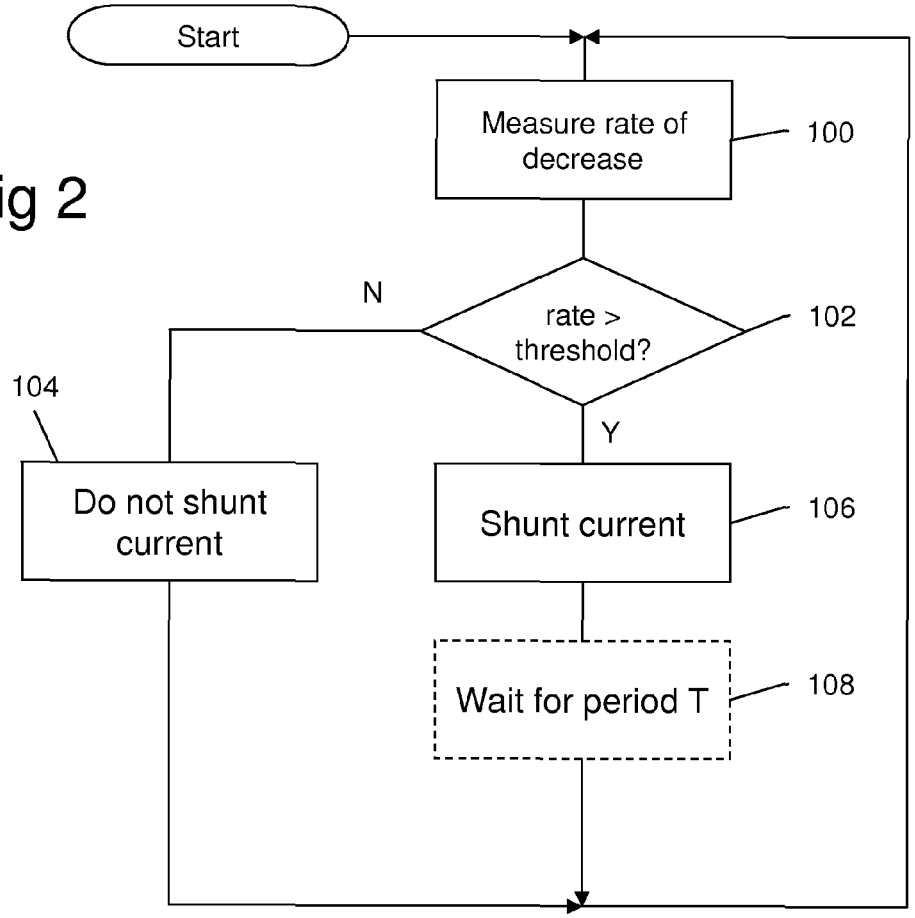
FIG. 2 shows a flowchart depicting the operation of the circuit of FIG. 1.

The operation of this circuit can be shown with respect to FIG. 2 of the accompanying drawings. The method commences at step 100. Here, the slope-determining circuit 9 determines the slope (that is, the rate of decrease) of the mean voltage across the APD module 3.

At step 102, the slope-determining circuit determines whether the slope is greater than the threshold. If it is not, it ensures that the transistor switch 8 remains open at step 104 and the method reverts to step 100. If it is greater, then at step 106 the slope-determining circuit 9 closes the transistor switch 8 to allow current to be shunted.

In one embodiment (that without the optional step 108 shown in dotted lines), this shunting of current sets up its own decrease in the voltage across APD module 3 as capacitor 4 discharges. According, as the method then reverts to step 100, a positive feedback situation is set up, in which the decrease in voltage due to current being shunted through the transistor switch is sufficient to keep the slope above the threshold and so maintain the shunting of current. In such a case, the voltage across the APD unit will fall until near a floor value (often zero volts) before the transistor switch 8 is opened again.

In an alternative embodiment, the optional step 108 is included. In this step, the slope-determining circuit 9 pauses for a predetermined period T before proceeding back to step 100. This ensures that current is shunted for at least the period T before determining whether to carry on shunting current.

The effect of either embodiment is that when the incident light level is suddenly increased, insufficient energy is transferred from the capacitor 4 to the APD 1 to cause any permanent damage. Instead, current flows through the transistor switch 8, which is able to 'sink' the current and energy without damage.

The slope-determining circuit 9 can have its own dedicated power supply (not shown) that may or may not be derived from the voltage source 6. The current at the input of the slope detector in steady state conditions is expected to be negligible compared with the 'dark' current of the APD. This is usually necessary so that the absolute mean intensity of the incident light can be inferred by monitoring the current flowing through the impedance 5.

As such, a circuit according to this embodiment of the invention can provide protection to an APD. The cost of providing the current shunt circuit is thought to be significantly less than that of having to replace an APD when it is damaged by a sudden increase in light levels.

The invention claimed is:

1. An avalanche photodiode circuit comprising:
an avalanche photodiode;
a current shunt circuit coupled to an input port of the avalanche photodiode and arranged to shunt current from the avalanche photodiode in response to detecting a decrease in an impedance of the avalanche photodiode,
wherein the current shunt circuit comprises a voltage slope-determining circuit operable to determine a rate of change of voltage across the avalanche photodiode and configured to detect the decrease in the impedance of the avalanche photodiode by detecting a rate of decrease in a voltage across the avalanche photodiode and activating the current shunt circuit in response to the rate of decrease in the voltage across the avalanche photodiode being greater than a threshold rate.

2. The avalanche photodiode circuit of claim 1, in which there is provided a capacitor in parallel with the avalanche photodiode.

3. The circuit of claim 1, in which the current shunt circuit comprises a normally open switch coupled in parallel with the avalanche photodiode, the switch being arranged to close should the current shunt circuit detect the decrease in impedance of the avalanche photodiode.

4. The circuit of claim 1, in which the circuit comprises a branch comprising a transimpedance amplifier connected in series with the avalanche photodiode, the voltage across the whole branch being used to detect the decrease in the impedance of the avalanche photodiode.

5. The circuit of claim 1, wherein the shunt circuit is configured to shunt current at a sufficient rate once the shunt circuit has started shunting current so as to allow the voltage across the avalanche photodiode to decrease at a sufficient rate due to the shunting of current that the current shunt circuit will keep shunting current until the rate of voltage change across the avalanche photodiode falls below a threshold.

6. The circuit of claim 1, wherein the shunt circuit is configured to keep shunting current for a predetermined length of time once the shunt circuit has started shunting current.

7. The avalanche photodiode circuit of claim 1, in which there is provided a capacitor connected to the input port of the avalanche photodiode and configured to decouple an applied bias voltage from input signal modulation.

8. The circuit of claim 1, in which the current shunt circuit comprises a normally open switch coupled to the input port of the avalanche photodiode, the switch being arranged to close should the current shunt circuit detect the decrease in impedance of the avalanche photodiode.

9. A method of protecting an avalanche photodiode circuit having an avalanche photodiode, the method comprising shunting current from the avalanche photodiode in response to detecting a decrease in an impedance of the avalanche photodiode,
wherein detecting the decrease in the impedance of the avalanche photodiode comprises:
using a voltage slope-determining circuit to determine a rate of change of voltage across the avalanche photodiode, and to detect the decrease in impedance of the avalanche photodiode by detecting a rate of decrease in a voltage across the avalanche photodiode and to perform the shunting step in response to the rate of decrease in the voltage across the avalanche photodiode being greater than a threshold rate.

10. The method of claim 9, in which the avalanche photodiode is connected in parallel with at an input port to a capacitor that is configured to decouple an applied bias voltage from input signal modulation.

11. The method of claim 9, in which once current has started to be shunted, shunting continues until the voltage across the avalanche photodiode falls below a lower threshold.

12. The method of claim 9, in which once the current has started being shunted, shunting continues for a predetermined length of time.

13. The method of claim 9, in which the avalanche photodiode is connected at an input port to a capacitor that is configured to decouple an applied bias voltage from input signal modulation.

* * * * *